(12) United States Patent
Ni et al.

(10) Patent No.: US 11,532,355 B2
(45) Date of Patent: Dec. 20, 2022

(54) NON-VOLATILE MULTI-LEVEL CELL MEMORY USING A FERROELECTRIC SUPERLATTICE AND RELATED SYSTEMS

(71) Applicants: The Regents of the University of California, Oakland, CA (US); University of Notre Dame du Lac, South Bend, IN (US)

(72) Inventors: Kai Ni, Notre Dame, IN (US); Suman Datta, South Bend, IN (US); Andrew Kummel, San Diego, CA (US)

(73) Assignees: THE REGENTS OF THE UNIVERSITY OF CALIFORNIA, Oakland, CA (US); UNIVERSITY OF NOTRE DAME DU LAC, South Bend, IN (US)

( * ) Notice: Subject to any disclaimer, the term of this patent is extended or adjusted under 35 U.S.C. 154(b) by 11 days.

(21) Appl. No.: 17/032,847

(22) Filed: Sep. 25, 2020

(65) Prior Publication Data

US 2021/0098060 A1 Apr. 1, 2021

Related U.S. Application Data

(60) Provisional application No. 62/906,389, filed on Sep. 26, 2019.

(51) Int. Cl.
*G11C 11/56* (2006.01)
*G11C 11/22* (2006.01)
*H01L 49/02* (2006.01)
*H01L 27/11507* (2017.01)

(52) U.S. Cl.
CPC ........ *G11C 11/5657* (2013.01); *G11C 11/221* (2013.01); *G11C 11/2275* (2013.01); *H01L 27/11507* (2013.01); *H01L 28/60* (2013.01)

(58) Field of Classification Search
CPC ... G11C 11/22; G11C 11/221; G11C 11/2275; G11C 11/5657
USPC ........................................................ 365/145
See application file for complete search history.

(56) References Cited

U.S. PATENT DOCUMENTS

2017/0256552 A1* 9/2017 Schroder ........... H01L 29/78391
2018/0240804 A1* 8/2018 Yoo .................. H01L 21/02356

OTHER PUBLICATIONS

Boni, G.A. et al., "Multiple polarization states in symmetric ferroelectric heterostructures for multi-bit non-volatile memories," *Nanoscale*; pp. 19271-19278; (2017).
Dogan, M. et al., "Single atomic layer ferroelectric on silicon," *Nano Lett.*; pp. 241-246; (2018).
Dunkel, S. et al., "A FeFET based super-low-power ultra-fast embedded NVM technology for 22nm FDSOI and beyond," *IEDM*; pp. 19.7.1-19.7.4; (2017).

(Continued)

*Primary Examiner* — Alfredo Bermudez Lozada
(74) *Attorney, Agent, or Firm* — Stanek Lemon Crouse & Meeks, P.A.

(57) ABSTRACT

An N-bit non-volatile multi-level memory cell (MLC) can include a lower electrode and an upper electrode spaced above the lower electrode. N ferroelectric material layers can be vertically spaced apart from one another between the lower electrode and the upper electrode, wherein N is at least 2 and at least one dielectric material layer having a thickness of less than 20 nm can be located between the N ferroelectric material layers.

16 Claims, 10 Drawing Sheets

(56) References Cited

OTHER PUBLICATIONS

Jerry, M. et al., Ferroelectric FET analog synapse for acceleration of deep neural network training. *IEEE International Electron Devices Meeting*, 139-142 (2017).

Katsumata, R., et al., Pipe-shaped BiCS flash memory with 16 stacked layers and multi-level-cell operation for ultra high density storage devices, *Symposium of VLSI*, 6.2.1-6.2.4; (2009).

Lee, D. et al., "Active control of ferroelectric switching using defect-dipole engineering", *Advanced Materials*; pp. 6490-6495 (2012).

Ni, K. et al., Fundamental understanding and control of device-to-device variation in deeply scaled ferroelectric FETs. *Symposium of VLSI*; pp. 40-41 (2019).

Ni, K. et al, "SoC logic compatible multi-bit FeMFET weight cell for neuromorphic applications," *IEDM*; 13.2.1-13.2.4; (2018).

Schenk, T. et al., Complex internal bias fields in ferroelectric hafnium oxide, *ACS Appl. Mater. Interfaces*; 29 pages (2015).

\* cited by examiner

NON-VOLATILE MULTI-LEVEL CELL MEMORY USING A FERROELECTRIC SUPERLATTICE AND RELATED SYSTEMS

CLAIM FOR PRIORITY

This application claims priority to U.S. Provisional Application Ser. No. 62/906,389, titled Novel Ferroelectric Superlattice Based Multi-Level Cell Non-Volatile Memory, filed in the U.S. Patent and Trademark Office on Sep. 26, 2019, the entire disclosure of which is hereby incorporated herein by reference.

STATEMENT OF GOVERNMENT SUPPORT

This invention was made with government support under Agreement No. HR0011-18-3-0004 awarded by The Defense Advanced Research Projects Agency (DARPA). The government has certain rights in this invention.

BACKGROUND

It is known to implement non-volatile multi-level cell (MLC) memory using technology where different amounts of charge are stored in a floating gate or in a trap layer of a dielectric stack to store more than 1 bit of data in a single cell. This technology can be characterized by high power requirements, relatively slow speed, and requiring relatively high voltage long write pulses to program the memory.

Ferroelectric based non-volatile MLC memory using partially polarization switching has also been investigated, but to date has exhibited significant device-to-device variation, causing memory window collapse particularly when the device is scaled down. This collapse can be caused by domain inhomogeneity, limited number of domains, and stochasticity in switching probability. Therefore, it can be particularly challenging to realize an MLC memory with well-controlled device-to-device variation using the partial polarization switching in a ferroelectric.

Ferroelectric based non-volatile MLC memory using full polarization has also been investigated but can be difficult to scale down to the required device sizes while still maintaining operation of the device as an MLC. Ferroelectric based non-volatile MLC memories are discussed, for example, in G. A. "Multiple polarization states in symmetric ferroelectric heterostructures for multi-bit non-volatile memories," by Boni, et al., Nanoscale 2017.

SUMMARY

Embodiments according to the present invention can provide a non-volatile multi-level cell memory using a ferroelectric superlattice and related systems. Pursuant to these embodiments, an N-bit non-volatile multi-level memory cell (MLC) can include a lower electrode and an upper electrode spaced above the lower electrode. N ferroelectric material layers can be vertically spaced apart from one another between the lower electrode and the upper electrode, wherein N is at least 2 and at least one dielectric material layer having a thickness of less than 20 nm can be located between the N ferroelectric material layers.

In some embodiments according to the invention, an N-bit non-volatile multi-level memory cell (MLC) can include a lower electrode and an upper electrode spaced above the lower electrode. N ferroelectric material layers can be vertically spaced apart from one another between the lower electrode and the upper electrode, wherein N is at least 2 and at least one dielectric material layer can be located between the N ferroelectric material layers, wherein each of the N ferroelectric material layers can be configured to provide a respective polarization to encode N states for the N-bit non-volatile multi-level memory cell.

In some embodiments according to the invention, an N-bit non-volatile multi-level memory cell (MLC) can include a lower electrode and an upper electrode spaced above the lower electrode. N ferroelectric material layers can be vertically spaced apart from one another between the lower electrode and the upper electrode, wherein N is at least 2 and at least one dielectric material layer can be located between the N ferroelectric material layers, wherein the N ferroelectric material layers can provide a multi-peak $E_c$ distribution associated with each peak in the multi-peak $E_c$ distribution representing a respective data bit in the MLC.

BRIEF DESCRIPTION OF THE DRAWINGS

FIGS. 1A-1L are representations of a superlattice memory including FE layers separated by insulators in some embodiments according to the present invention in comparison to conventional alternative arrangements including a single ferroelectric material and a single anti-ferroelectric material, a respective hysteresis loop, associated current peaks (responsive to a field Voltage), and respective probability distribution for each of the $E_c$ peaks provided by the structure.

DETAILED DESCRIPTION OF EMBODIMENTS ACCORDING TO THE INVENTION

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As appreciated by the present inventors, a ferroelectric based non-volatile MLC memory can be implemented using a superlattice stack of relatively thin alternating ferroelectric (FE) and dielectric (DE) layers. The thin superlattice structure can enable targeted layer-by-layer polarization switching for each DE layer. This approach stems from the realization that if a multi-peak $E_c$ distribution can be provided where the distribution associated with each of the isolated peaks represents a respective data bit in the MLC that is fully switched during a write operation, then a FE based non-volatile memory cell that overcomes many of the issues described herein may be provided. It will be understood that the write pulses and the read pulses can be provided by a circuit that is configured to generate the series of pulses with the amplitude and the polarity described herein in the particular order and combination to set the polarization for each of the ferroelectric layers to encode any of the N states for the multi-level memory cell As further appreciated by the present inventors, the superlattice stack described herein can provide that targeted layer-by-layer polarization switching for each DE layer. Accordingly, the superlattice structure including N FE layers can provide an $N_{bit}$ cell ferroelectric non-volatile memory cell. Further, the superlattice stack described herein can decrease the area allocated to the ferroelectric MLC non-volatile memory. Still further, the relatively thin FE/DE layers can decrease the thickness of the superlattice stack, which can reduce the overall thickness of a vertically arranged ferroelectric based non-volatile MLC memory.

Figure 1A:
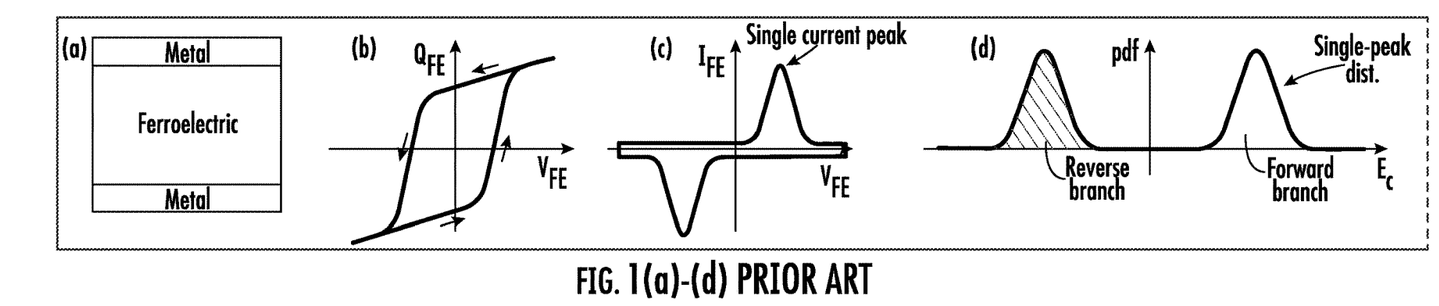
Figure 1E:
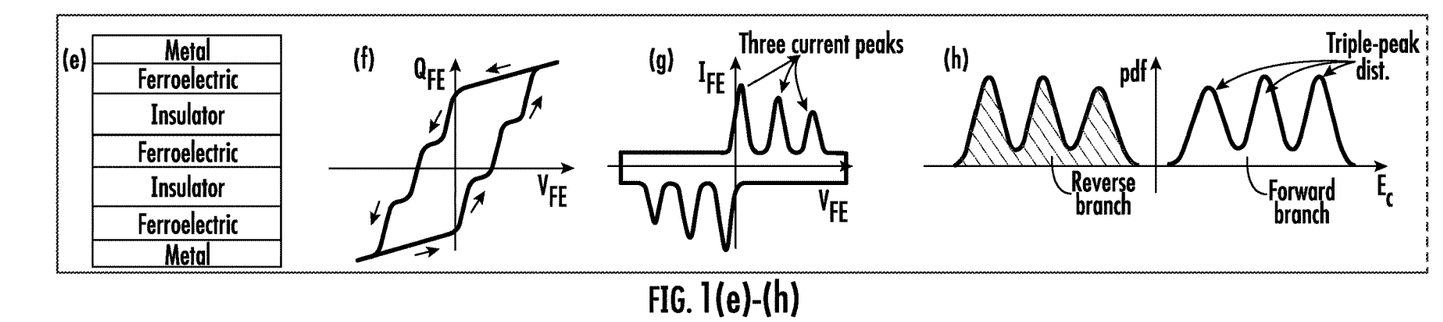
Figure 1I:
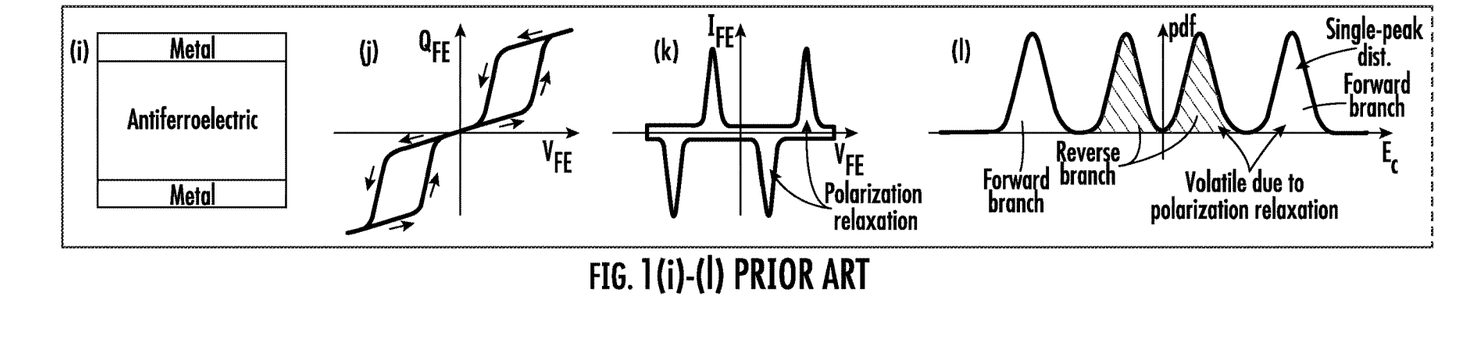

As described herein, a novel FE superlattice memory includes FE layers separated by non-FE layers (such as Dielectric layers), to realize the multi-peak $E_c$ distribution described above. A schematic representation of a superlattice memory including FE layers separated by insulators is shown in FIG. 1(e) in some embodiments according to the present invention in comparison to conventional alternative arrangements including a single ferroelectric material in FIG. 1A and a single anti-ferroelectric material in FIG. 1I. FIGS. 1F-1H show the hysteresis loop, the associated current peaks (responsive to a field Voltage), and the probability distribution for each of the $E_c$ peaks provided by the structure in FIG. 1E. FIGS. 1B-1D show the hysteresis loop, the associated current peaks (responsive to a field Voltage), and the probability distribution for each of the $E_c$ peaks provided by the structure in FIG. 1A. Further, FIGS. 1J-1L show the hysteresis loop, the associated current peaks (responsive to a field Voltage), and the probability distribution for each of the $E_c$ peaks provided by the structure in FIG. 1I.

According to FIG. 1E the superlattice FE memory includes three separated ferroelectric layers sandwiched between upper and lower electrodes to provide a multi-peak $E_c$ distribution with three separate peaks, thereby enabling each of the three FE layers to operate as a separate data bit in the cell. This is further indicated in FIG. 1H showing the probability distribution for each of the $E_c$ peaks including three $E_c$ distributions in the forward branch of the hysteresis loop of FIG. 1F and three $E_c$ distributions in the reverse branch of the hysteresis loop of FIG. 1F and the associated current peaks in FIG. 1G. Accordingly, the three FE layers in the superlattice FE memory in FIG. 1E enable operation as a 3 bit memory cell in some embodiments according to the present invention.

Figure 2A:
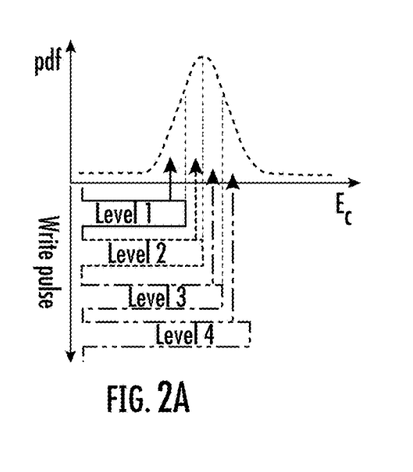
FIGS. 2A-2D are schematic comparative representations of a partial polarization FE 3 bit memory cell having single peak $E_c$ distribution in (a) and the corresponding overlapping probability distributions in (b) for the eight states and a multi-peak (3) $E_c$ distribution in (c) for a three bit superlattice memory according to the present invention and the corresponding widely separated probability distributions in (d) for the eight states.
Figure 2B:
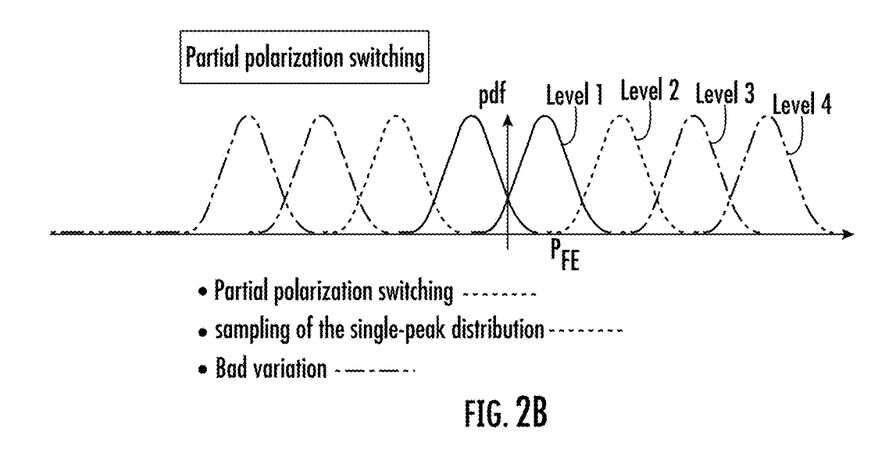
Figure 2C:
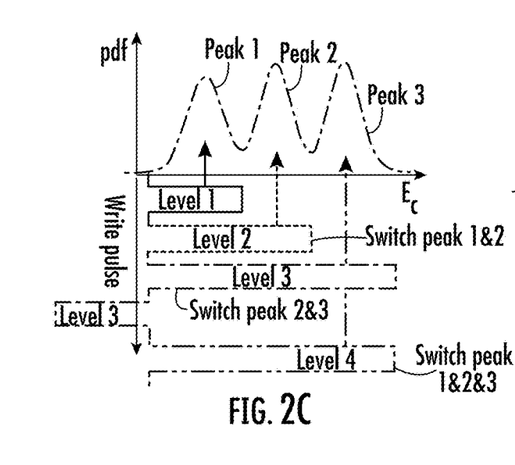
Figure 2D:
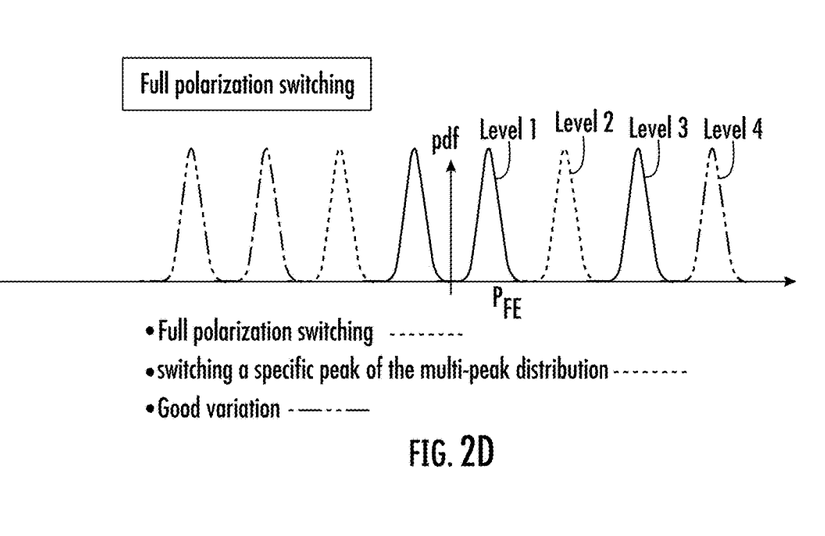

FIGS. 2A-2D are schematic comparative representations of a partial polarization FE 3 bit memory cell having single peak $E_c$ distribution in (a) and the corresponding overlapping probability distributions in (b) for the eight states and a multi-peak (3) $E_c$ distribution in (c) for a three bit superlattice memory according to the present invention and the corresponding widely separated probability distributions in (d) for the eight states. FIG. 2C also incorporates write pulses used to polarize respective ones of the three layers. For example, the level 1 pulse reaches the upper value of the Ec for layer 1, the level 2 pulse reaches the upper value of Ec for the second layer, and the level 3 pulse reaches the upper value of the Ec for layer 3. Further, more a negative going write pulse is also shown with the level 3 pulse so that the effect of the positive and negative going pulse is to first switch the polarization of layers 1, 2, and 3 followed by the switching the first layer back to its state of polarization before applying the first train of pulses.

Figure 3:
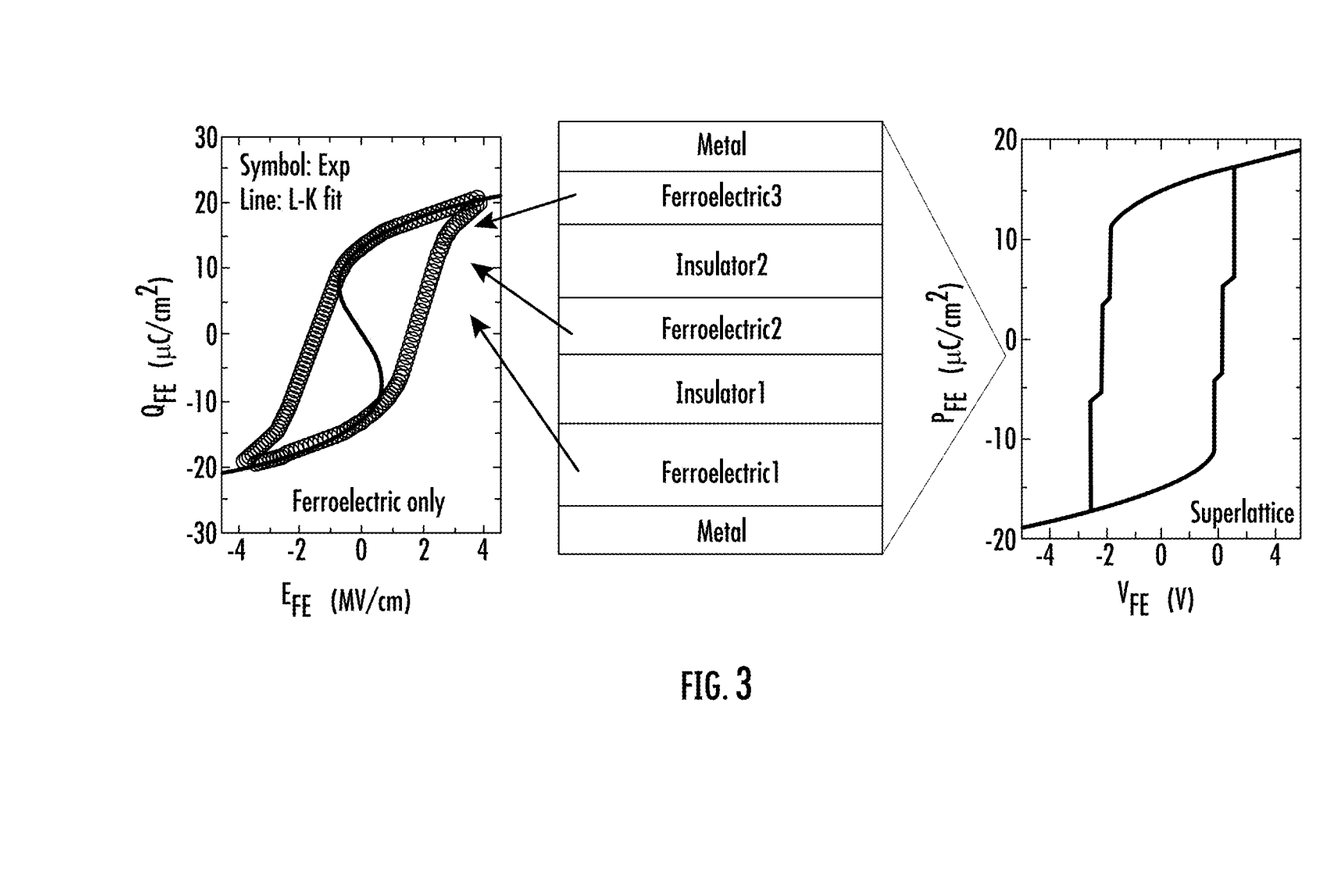
FIG. 3 illustrates a kinetic Monte Carlo (KMC) modeling framework used to demonstrate that the multi-peak $E_c$ landscape described herein can be achieved by controlled layer-by-layer switching of individual FE layers in some embodiments according to the present invention.
Figure 4A:
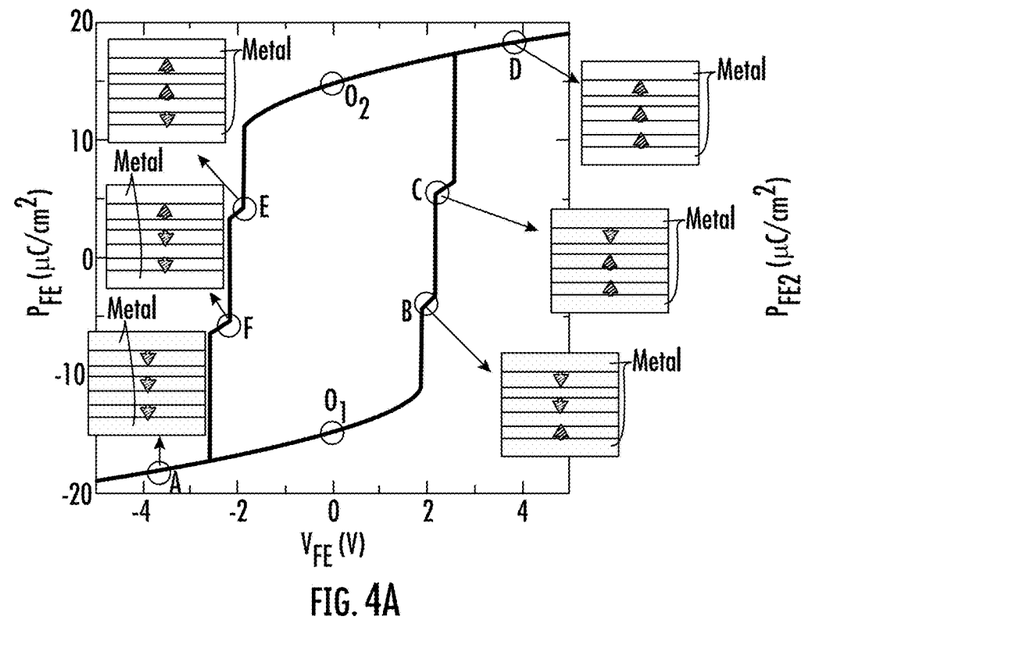
FIGS. 4A-4B illustrate a hysteresis loop of a 3 bit FE memory cell annotated with the polarization direction of each of the FE layers when in a particular state A-F, a schematic illustration of voltage pulses utilized to switch the individual FE layers through each of the states A-H, and the associated polarization directions of each of the three layers for states A-H respectively in some embodiments.
Figure 4B:
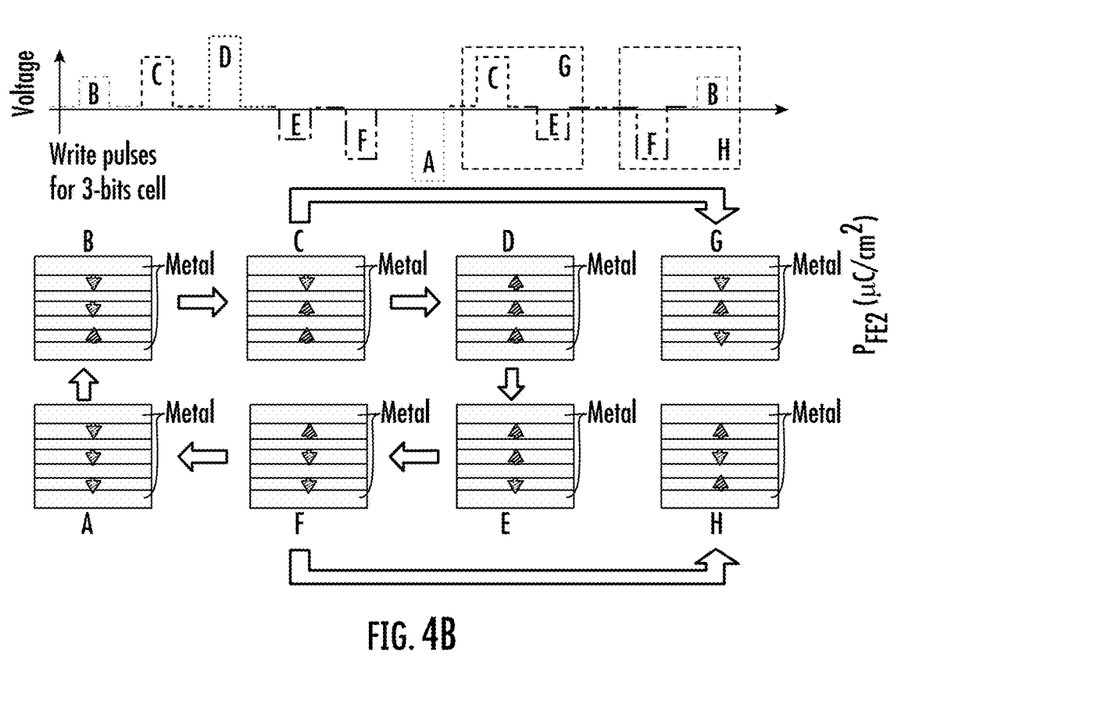
Figure 5:
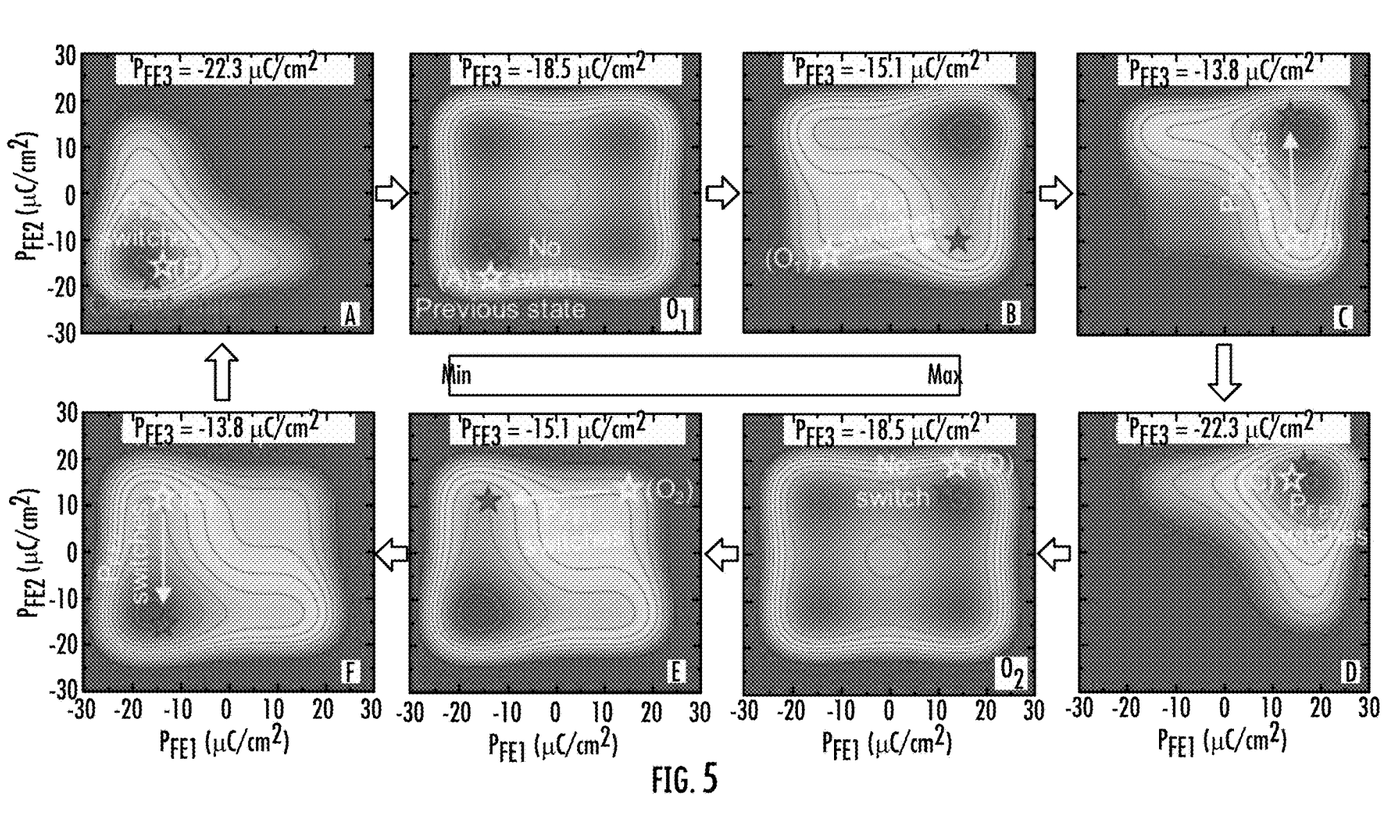
FIG. 5 illustrates a sequence of the surface Gibbs free energy contours projected onto the $P_{FE1}$-$P_{FE2}$ plane ($P_{FE3}$ value is fixed) corresponding to the transitions from states A-H as discussed in reference to FIGS. 4A and 4B in some embodiments.

According to FIGS. 3-5, a kinetic Monte Carlo (KMC) modeling framework is used to demonstrate that the multi-peak $E_c$ landscape described herein can be achieved by controlled layer-by-layer switching of individual FE layers in some embodiments according to the present invention. As shown in FIG. 3, this approach was utilized to analyze a 3-bit/cell superlattice MLC in some embodiments according to the present invention.

The superlattice stack is modeled based on the Landau-Khalatnikov theory of FE. In particular, the volume Gibbs free energy of the individual FE and DE layers is combined and weighted with their respective thicknesses to obtain the total surface Gibbs free energy:

Gibbs Energy
$$\begin{cases} g_{DE1} = -\frac{1}{2}\varepsilon_{DE1}E_{DE1}^2 \\ g_{FE1} = -\frac{1}{2}\varepsilon_{FE1}E_{FE1}^2 - P_{FE1}E_{FE1} + \frac{1}{2}\alpha_{FE1}P_{FE1}^2 + \frac{1}{4}\beta_{FE1}P_{FE1}^4 \end{cases}$$

Boundary cond.
$$\begin{cases} \varepsilon_{FE3}E_{FE1} + P_{FE1} = \varepsilon_{DE3}E_{DE3} = \\ \varepsilon_{FE2}E_{FE2} + P_{FE2} = \varepsilon_{DE2}E_{DE2} + \varepsilon_{FE3}E_{FE3} + P_{FE3} \\ E_{FE3}l_{FE1} + E_{DE1}l_{DE1} + E_{FE2}l_{FE2} + E_{DE2}l_{DE2} + E_{FE2}l_{FE3} = V_a \end{cases}$$

Minimize surface Gibbs energy density with respect to

Surface Gibbs Energy: $P_{FE1}, P_{FE2}, P_{FE3}$ at a given bias $V_a$ $$G(V_a, P_{FE1}, P_{FE2}, P_{FE3}) = \sum_i l_{FE1}g_{FE1} + \sum_i l_{DE1}g_{DE1}$$

After considering the electrical boundary conditions, the surface Gibbs free energy is a function of the polarization in each FE layer. Therefore, for every bias point, the polarization states can be determined by minimizing the surface Gibbs free energy.

The simulated $P_{FE}$-$V_{FE}$ hysteresis loop of the superlattice with three FE layers of Figure separated by DE layers exhibits a three-step switching characteristic shown in FIGS. 4A-4B, indicating a triple-peak $E_c$ distribution. In particular, FIG. 4A illustrates the hysteresis loop (a) of the 3 bit FE memory cell annotated with the polarization direction of each of the FE layers when in a particular state A-F. FIG. 4B is a schematic illustration of voltage pulses utilized to switch the individual FE layers through each of the states A-H in FIG. 4A and the associated polarization directions of each of the three layers for states A-H in some embodiments.

According to FIG. 4A the polarization configuration in each layer is shown at several points on the loop. The intermediate states (point B, C and E, F) correspond to a single layer switching. When the voltage is swept from negative to positive, a controlled layer-by-layer switching is observed, due to the electrostatic interaction between the polarizations at different layers. Switching in one layer modifies the electric field in the others, which in turn changes the switching characteristics for the targeted layer.

In FIG. 4A only 6 states (A-F) are shown in $P_{FE}$-$V_{FE}$ hysteresis loop while the remaining 2 states (G-H) are hidden. This is because those hidden states (states G and H), are accessed using a specific combination of write pulses. For example, state G can be accessed by reaching state C first, and then switching the first layer back again (using the negative voltage write pulse labeled E). Similarly, state H can be accessed by reaching state E first, and then switching the first layer back again (using the positive voltage write pulse labeled B). Accordingly, the FE superlattice provides an effective approach to realize an MLC memory.

FIG. 5 shows a sequence of the surface Gibbs free energy contours projected onto the $P_{FE1}$-$P_{FE2}$ plane ($P_{FE3}$ value is fixed) corresponding to the transitions from states A-H as discussed in reference to FIGS. 4A and 4B. With the change in electrical bias, the progressive switching of an individual FE layer is clearly shown.

Figure 6A:
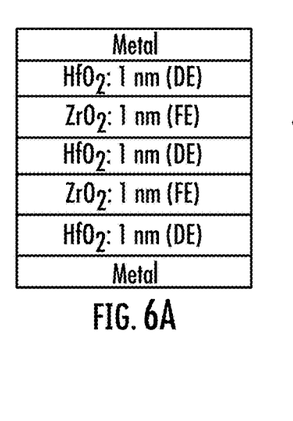
FIG. 6A is a schematic representation of 2 bit FE superlattice memory cell including a 1 nm thick DE (HfO2) layer between 2 1 nm thick FE (ZrO2) layers sandwiched between tungsten upper and lower electrodes in some embodiments according to the present invention.
Figure 6B:
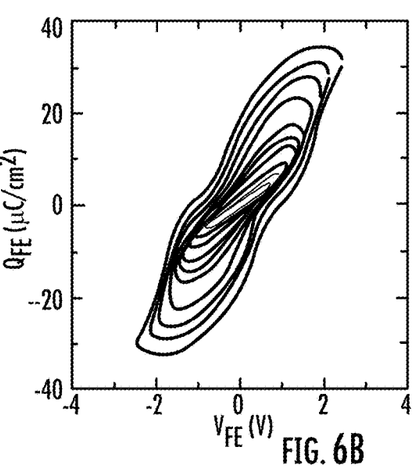
FIGS. 6B-6C are a hysteresis loop and a FORC curve, respectively for the device shown in FIG. 6A in some embodiments according to the present invention.
Figure 6C:
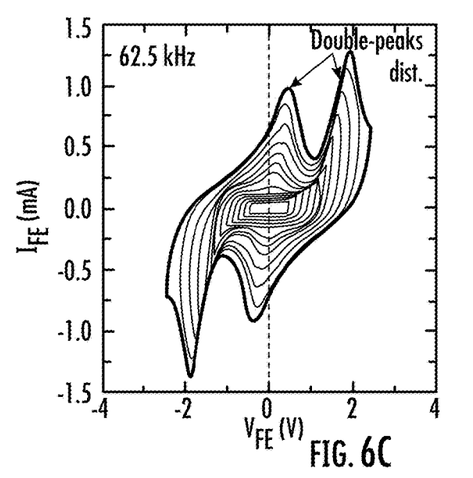

FIG. 6A is a schematic representation of 2 bit FE superlattice memory cell including a 1 nm thick DE (HfO2) layer between 2 1 nm thick FE (ZrO2) layers sandwiched between tungsten upper and lower electrodes in some embodiments according to the present invention. FIGS. 6B-6C are a hysteresis loop and a FORC curve, respectively for the device shown in FIG. 6A.

Figure 6D:
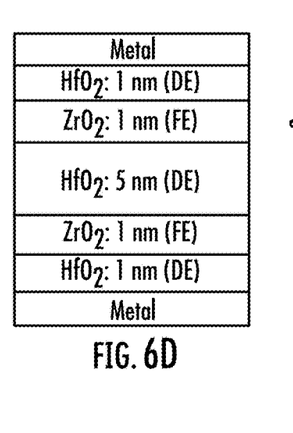
FIG. 6D is a schematic representation of a 2 bit FE superlattice memory cell including a 5 nm thick DE (HfO2) layer between 2 1 nm FE (ZrO2) layers all sandwiched between tungsten upper and lower electrodes in some embodiments according to the present invention.
Figure 6E:
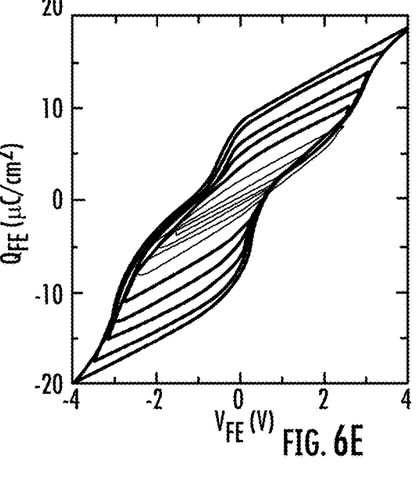
FIGS. 6E-6F are a hysteresis loop and a FORC curve, respectively for the device shown in FIG. 6D in some embodiments according to the present invention.
Figure 6F:
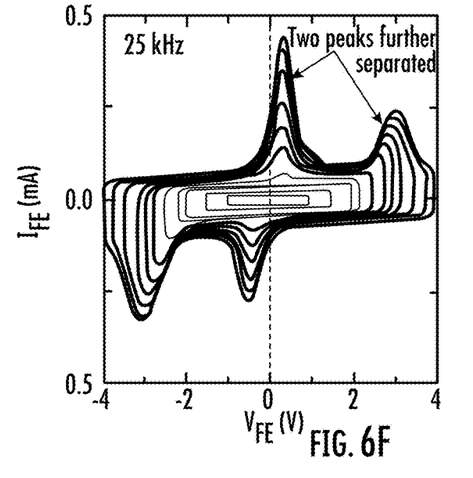

FIG. 6D is a schematic representation of a 2 bit FE superlattice memory cell including a 5 nm thick DE (HfO2) layer between 2 1 nm FE (ZrO2) layers all sandwiched between tungsten upper and lower electrodes in some embodiments according to the present invention. FIGS. 6E-6F are a hysteresis loop and a FORC curve, respectively for the device shown in FIG. 6D.

The FE/DE layers in the devices shown in FIGS. 6A and 6D were formed on a highly doped (1019 cm−3) p-Si substrate with sputtered tungsten (W) lower and upper electrodes and annealed at 600° C. in N2 for crystallization and stabilization of the FE phases. The HfO2/ZrO2 superlattice was fabricated with supercycles of either HfO2 or ZrO2 to form approximated 1 nm HfO2 and ZrO2 in N2. In some embodiments according to the invention, a ferroelectric phase will form at the interface between ZrO2 and HfO2 after the anneal and initial wake up. In some embodiments according to the invention, the electrodes can be a conducting metal oxide (such as Iridium oxide, ruthenium oxide or the like). In some embodiments according to the invention, the electrodes can be a doped or undoped semiconductor. Other materials can also be used for the electrodes.

The device in FIG. 6A includes the $ZrO_2$ layers separated by a 1 nm thick $HfO_2$ spacer layer whereas, in the device in FIG. 6D the $HfO_2$ spacer layer thickness was 5 nm. As shown in FIGS. 6C and 6F, a double-peak distribution is readily observed in both samples, indicating that that the thin $ZrO_2$ layer is ferroelectric. The separation of the two peaks increases with the spacer layer $HfO_2$ thickness, which provides an insightful guideline towards the optimization of the $E_c$ distributions for MLC operation, as contributing to the reduced overlap between the peaks so that switching of each peak may be relatively independent of each other. In some embodiments according to the invention, the ferroelectric layers can have different thicknesses. In some embodiments according to the invention, the thicknesses of the ferroelectric layers can be graded such that the thicknesses change as with the position of a respective ferroelectric layer in the stack. In some embodiments according to the invention, the thickness of the ferroelectric layers can be in a range between about 0.5 nm and about 10 nm. In some embodiments according to the invention, the thickness of the dielectric layers can be in a range between about 0.5 nm and about 10 nm. It will also be understood that in some embodiments according to the invention, particular layers may have the characteristic of a dielectric material whereas the same layers may have the characteristic of a ferroelectric material. Still further, in some embodiments according to the invention, the thicknesses of the particular layer can cause the layer to have the respective characteristic. In some embodiments according to the invention, the interface between two contacting layers in the stack can create the characteristic of a ferroelectric material.

Figure 7A:
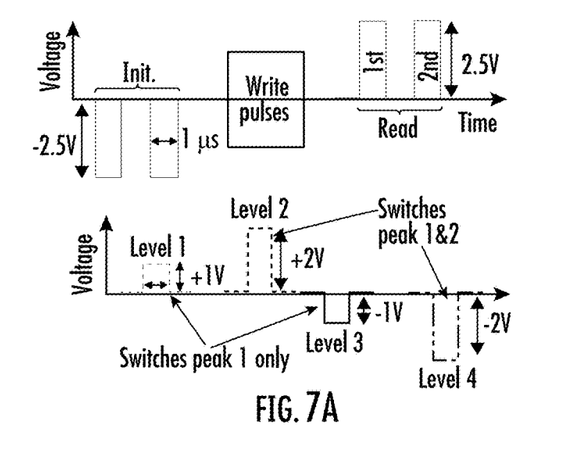
FIG. 7A is a modified positive-up-negative-down (PUND) pulse sequence applied to verify memory write and read operations of the devices shown in FIGS. 6A and 6D embodiments according to the present invention.
Figure 7B:
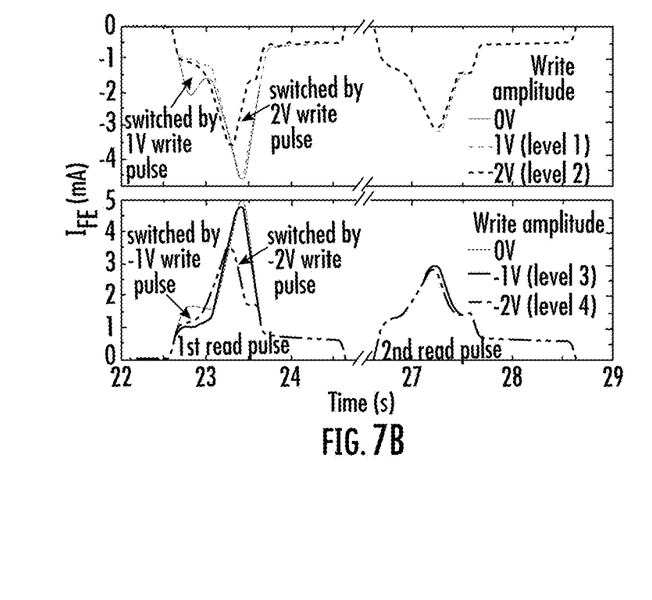
FIG. 7B are current waveforms induced by the read pulses in some embodiments according to the present invention.
Figure 7C:
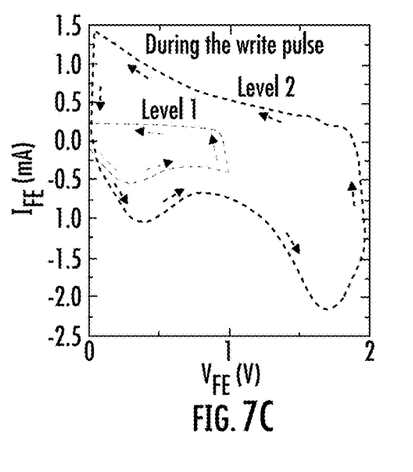
FIGS. 7C-7F illustrate IFE-VFE characteristics during the write pulses showing that ±1V write pulses only switch the distribution associated with the first peak, whereas ±2V write pulses switch both the peaks in some embodiments according to the present invention.
Figure 7D:
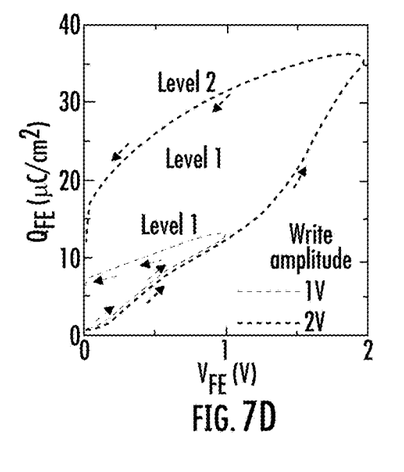
Figure 7E:
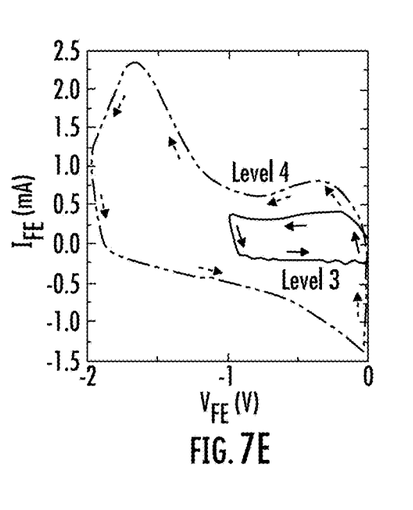
Figure 7F:
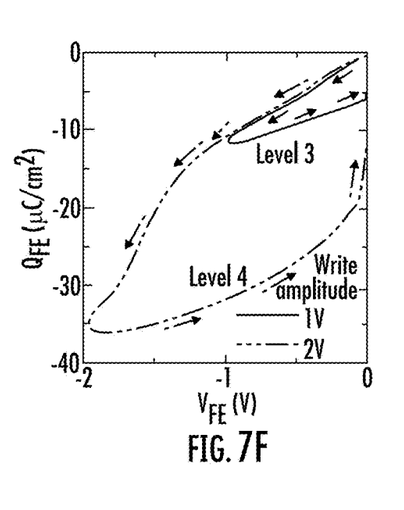

A modified positive-up-negative-down (PUND) pulse sequence (as shown in FIG. 7A) was applied to verify memory write and read operations of the devices shown in FIGS. 6A-6D. In each case, the device was initialized by the first two pulses whereas the last two pulses are used to read out the residual polarization that is left unswitched by the write pulse. As shown in FIG. 7A four write pulses are demonstrated. The transient current waveforms in FIG. 7B are induced by the read pulses. The IFE-VFE characteristics shown in FIGS. 7C-7D and FIGS. 7E-7F during the write pulses show that ±1V write pulses only switch the distribution associated with the first peak, whereas ±2V write pulses switch both the peaks. Therefore, all the domains in one distribution associated with an isolated peak can be switched individually through pulse engineering, in some embodiments. Accordingly, the multi-peak $E_c$ distribution can be utilized to realize an MLC memory device.

Figure 8A:
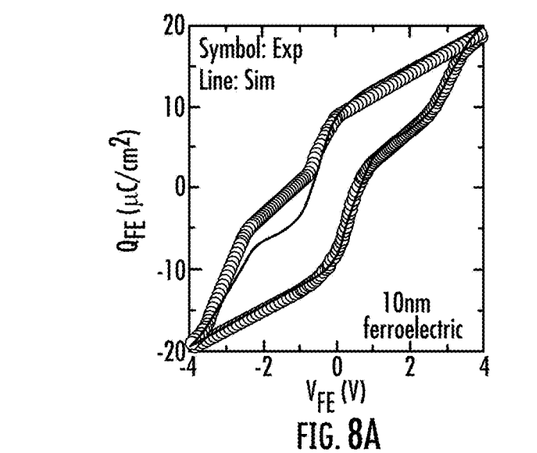
FIGS. 8A-8J show the calibration of the KMC model to the measured QFE-VFE, IFE-VFE characteristics and the extracted $E_c$ distribution for both the superlattice of FIG. 6D and a FE partial polarization sample formed of a HfZrO FE material sandwiched between tungsten electrodes using a process similar to that described above with reference to—FIGS. 6A-6F, respectively in some embodiments according to the present invention.
Figure 8B:
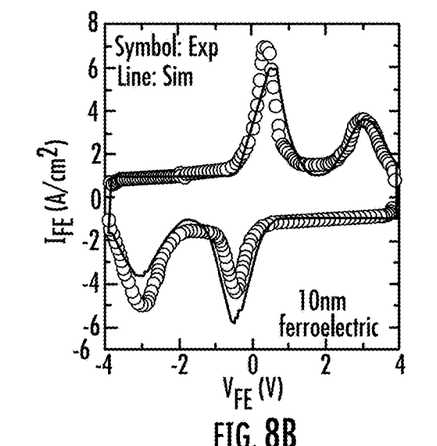
Figure 8C:
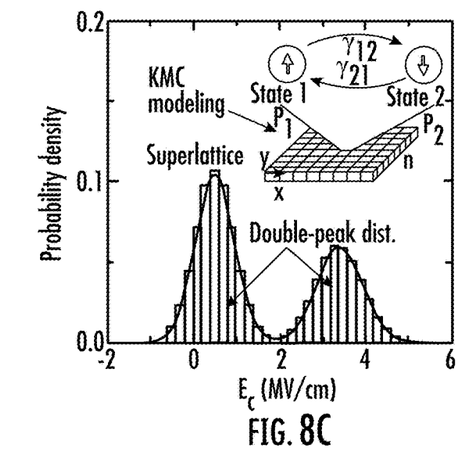
Figure 8D:
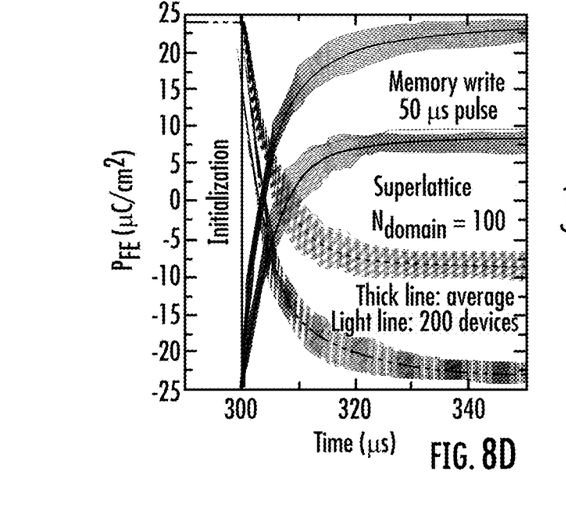
Figure 8E:
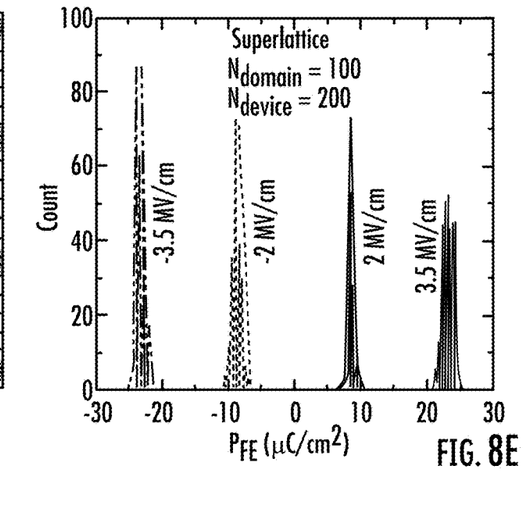
Figure 8F:
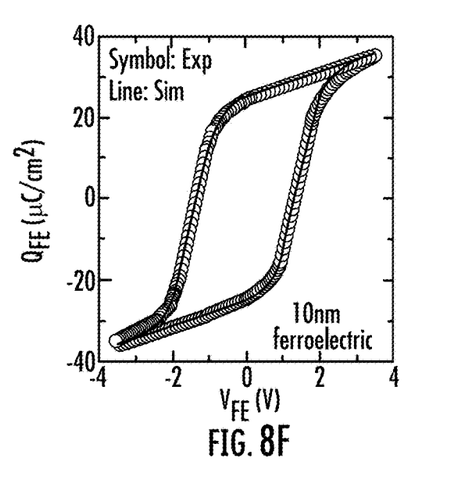
Figure 8G:
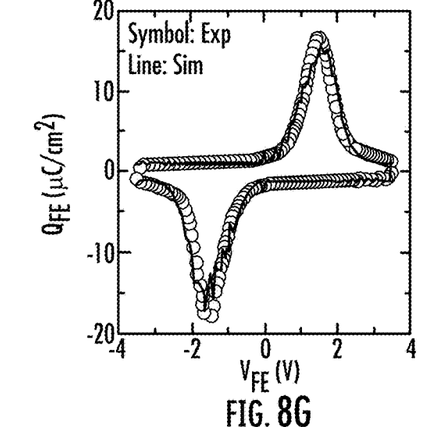
Figure 8H:
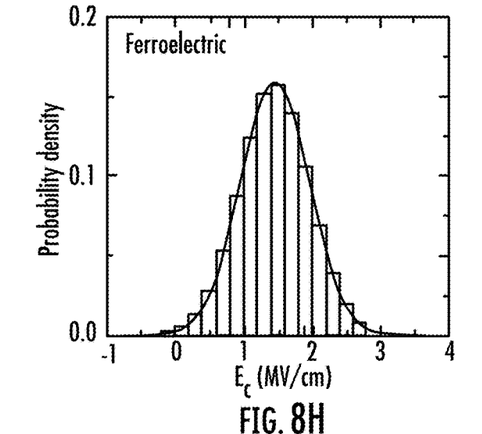
Figure 8I:
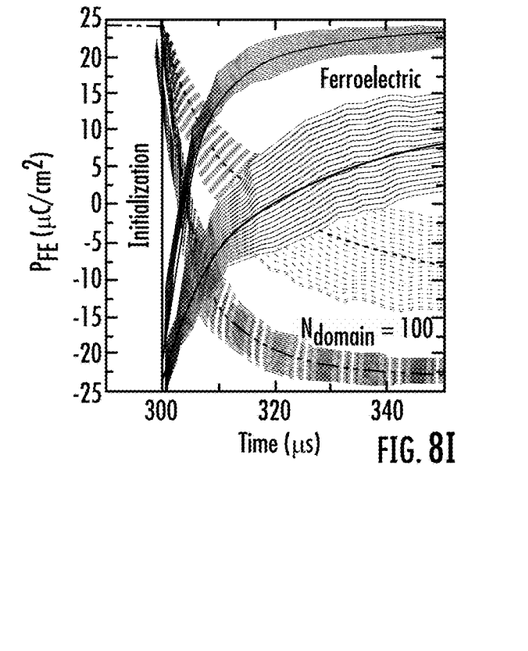
Figure 8J:
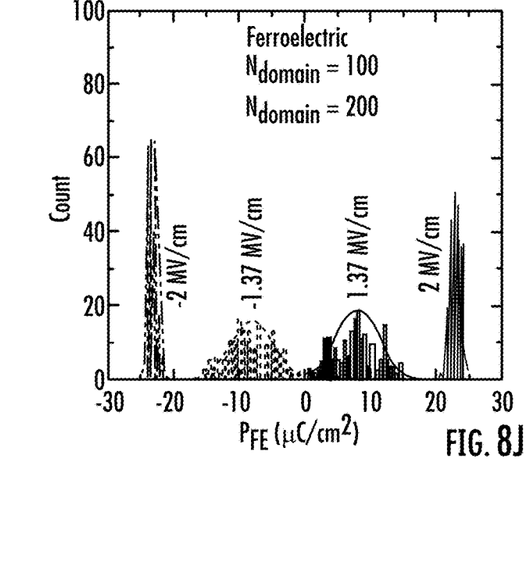

To further illustrate the advantages of full polarization switching in a multi-peak superlattice relative to the partial polarization switching in FE in implementing MLC, the KMC framework was utilized to evaluate the device-to-device variation. FIGS. 8A-8C and FIGS. 8F-8H show the calibration of the KMC model to the measured QFE-VFE, IFE-VFE characteristics and the extracted $E_c$ distribution for both the superlattice of FIG. 6D and a FE partial polarization sample formed of a HfZrO FE material sandwiched between tungsten electrodes using a process similar to that described above with reference to FIGS. 6A-6F, respectively. The devices were first initialized and write pulses similar to that shown in FIGS. 7A-7F were applied to access all four levels. The variations of the PFE during the write operation are shown in FIGS. 8D and 8I for both the superlattice and the FE.

With 100 domains, the superlattice exhibits a much better controlled variation compared with FE due to the fact that each peak in the double-peak distribution corresponds to one level and is fully switched by the write pulses. Therefore, the variation is tight irrespective of the distribution. However, for the partial polarization switching in FE, the distribution makes a significant impact on the variation. FIGS. 8E-8J show the PFE distribution after write pulses. States overlap in the FE case, whereas they are well separated in the superlattice.

Figure 9A:
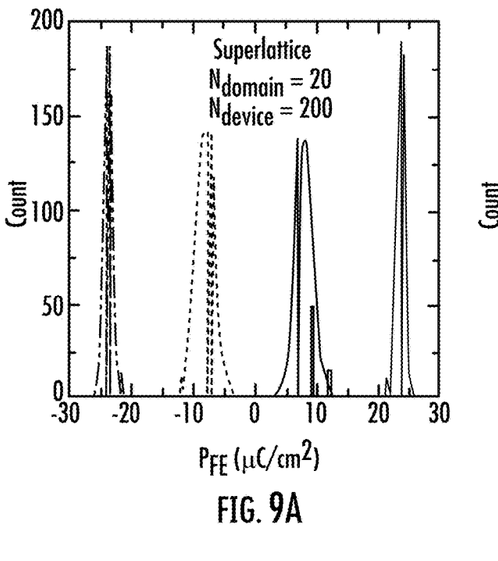
FIGS. 9A-9B illustrate the effect of scaling on the variation is shown in for the superlattice and FE, respectively in some embodiments according to the present invention.
Figure 9B:
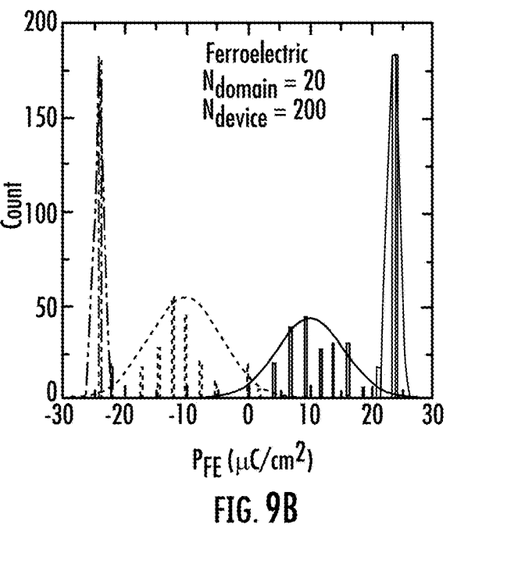
Figure 10A:
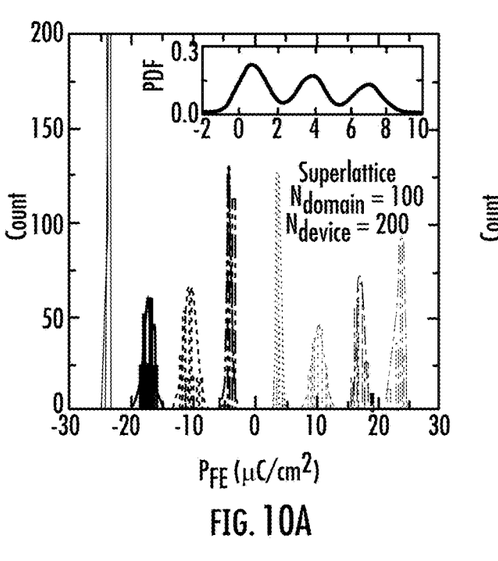
FIGS. 10A-10B illustrate a triple-peak distribution and simulated variation of the 8 levels in some embodiments according to the present invention.
Figure 10B:
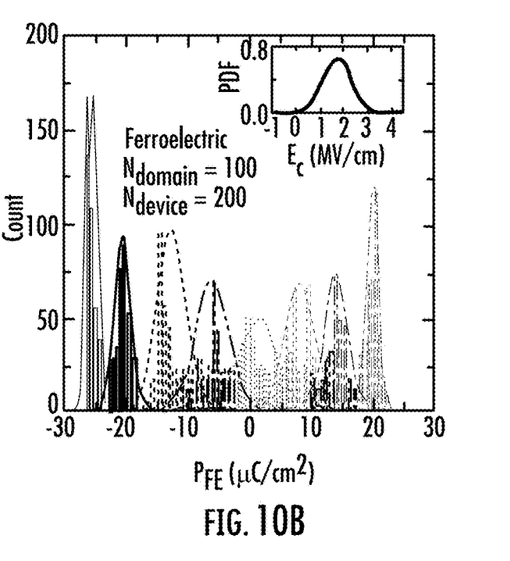

The effect of scaling (here the domain number is reduced to 20) on the variation is shown in FIGS. 9A and 9B for the superlattice and FE, respectively. The reduced domain number greatly increases the variation. However, because of the full polarization switching in the superlattice, the variation is still tight even with limited number of domains. Further, one peak is added to the double-peak $E_c$ distribution in FIG. 8C to form a triple-peak distribution and simulate the variation of the 8 levels as shown in FIGS. 10A-10B. The states strongly overlap in FE; while they remain separated in the superlattice.

As described herein, a ferroelectric based non-volatile MLC memory can be implemented using a superlattice stack of relatively thin alternating ferroelectric (FE) and dielectric (DE) layers. The thin superlattice structure can enable targeted layer-by-layer polarization switching for each DE layer. This approach stems from the realization that if a multi-peak $E_c$ distribution can be provided where the distribution associated with each of the isolated peaks represents a respective data bit in the MLC that is fully switched during a write operation, then a FE based non-volatile memory cell that overcomes many of the issues described herein may be provided.

As further appreciated by the present inventors, the superlattice stack described herein can provide that targeted layer-by-layer polarization switching for each DE layer. Accordingly, the superlattice structure including N FE layers can provide an $N_{bit}$ cell ferroelectric non-volatile memory cell. Further, the superlattice stack described herein can decrease the area allocated to the ferroelectric MLC non-volatile memory. Still further, the relatively thin FE/DE layers can decrease the thickness of the superlattice stack, which can reduce the overall thickness of a vertically arranged ferroelectric based non-volatile MLC memory.

The terminology used herein is for the purpose of describing particular embodiments only and is not intended to be limiting to other embodiments. As used herein, the singular forms "a," "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

What is claimed:

1. An N-bit non-volatile multi-level memory cell (MLC) comprising:
    a lower electrode;
    an upper electrode spaced above the lower electrode;
    a vertical stack of material layers sandwiched between the upper electrode and the lower electrode, the vertical stack of material layers including:
        N ferroelectric material layers vertically spaced apart from one another between the lower electrode and the upper electrode, wherein N is at least 2;
        at least one dielectric material layer having a thickness in a range between about 0.5 nm to about 10 nm located between the N ferroelectric material layers; and
    a write pulse circuit coupled across the upper electrode and the lower electrode, the write pulse circuit configured to apply predefined write pulse voltages of different levels across the upper electrode and the lower electrode to fully switch a polarization of any of the N ferroelectric material layers in the vertical stack of material layers without disturbing a polarization of other ones of the ferroelectric material layers in the vertical stack of material layers.

2. The N-bit non-volatile multi-level memory cell of claim 1 wherein N is equal to 2 providing a first ferroelectric material layer and a second ferroelectric material layer and the at least one dielectric material layer has a thickness of about 1 nm.

3. The N-bit non-volatile multi-level memory cell of claim 2 wherein the first ferroelectric material layer and a second ferroelectric material layer comprise ZrO2.

4. The N-bit non-volatile multi-level memory cell of claim 3 wherein the first ferroelectric material layer has a thickness of about 1 nm and a second ferroelectric material layer has a thickness of about 1 nm.

5. The N-bit non-volatile multi-level memory cell of claim 2 wherein the first ferroelectric material layer comprises $HfO_2$ and the second ferroelectric material layer comprises $HfO_2$.

6. The N-bit non-volatile multi-level memory cell of claim 1 wherein N is equal to 2 providing a first ferroelectric material layer and a second ferroelectric material layer and the at least one dielectric material layer has a thickness of about 5 nm.

7. The N-bit non-volatile multi-level memory cell of claim 6 wherein the first ferroelectric material layer and a second ferroelectric material layer comprise $ZrO_2$ and are located on opposite surfaces of the at least one dielectric material layer.

8. The N-bit non-volatile multi-level memory cell of claim 7 wherein the first ferroelectric material layer has a thickness of about 1 nm and a second ferroelectric material layer has a thickness of about 1 nm.

9. The N-bit non-volatile multi-level memory cell of claim 6 wherein the first ferroelectric material layer comprises $HfO_2$ and the second ferroelectric material layer comprises $HfO_2$.

10. The N-bit non-volatile multi-level memory cell of claim 1 wherein N ferroelectric material layers comprise a first ferroelectric material layer and a second ferroelectric material layer, the N-bit non-volatile multi-level memory cell further comprising:
 a first dielectric material layer between the upper electrode and the first ferroelectric material layer;
 a second dielectric material layer between the first ferroelectric material layer and the second ferroelectric material layer; and
 a third dielectric material layer between the lower electrode and the second ferroelectric material layer.

11. The N-bit non-volatile multi-level memory cell of claim 10 wherein:
 the first dielectric material layer has a thickness of about 1 nm and comprises $HfO_2$;
 the first ferroelectric material layer has a thickness of about 1 nm and comprises $ZrO_2$
 the second dielectric material layer has a thickness of about 1 nm and comprises $HfO_2$;
 the second ferroelectric material layer has a thickness of about 1 nm and comprises $ZrO_2$; and
 the third dielectric material layer has a thickness of about 1 nm and comprises $HfO_2$.

12. The N-bit non-volatile multi-level memory cell of claim 10 wherein:
 the first dielectric material layer has a thickness of about 1 nm and comprises $HfO_2$;
 the first ferroelectric material layer has a thickness of about 1 nm and comprises $ZrO_2$
 the second dielectric material layer has a thickness of about 5 nm and comprises $HfO_2$;
 the second ferroelectric material layer has a thickness of about 1 nm and comprises $ZrO_2$; and
 the third dielectric material layer has a thickness of about 1 nm and comprises $HfO_2$.

13. The N-bit non-volatile multi-level memory cell of claim 10 wherein:
 the first ferroelectric material layer has a thickness in a range between about 0.5 nm and about 10 nm.

14. The N-bit non-volatile multi-level memory cell of claim 10 wherein:
 the second dielectric material layer has a thickness in a range between about 0.5 nm and about 10 nm.

15. The N-bit non-volatile multi-level memory cell of claim 1 wherein the vertical stack of material layers provides a multi-peak $E_c$ distribution wherein each peak in the multi-peak $E_c$ distribution provides a respective data bit in the MLC.

16. The N-bit non-volatile multi-level memory cell of claim 15 wherein each of the peaks in the multi-peak $E_c$ distribution is non-overlapping.

* * * * *

UNITED STATES PATENT AND TRADEMARK OFFICE
CERTIFICATE OF CORRECTION

PATENT NO. : 11,532,355 B2  Page 1 of 4
APPLICATION NO. : 17/032847
DATED : December 20, 2022
INVENTOR(S) : Ni et al.

It is certified that error appears in the above-identified patent and that said Letters Patent is hereby corrected as shown below:

In the Drawings

FIG. 7C: Please correct the scale in FIG. 7C to read -- -1.0 -- as shown below:
Reads:

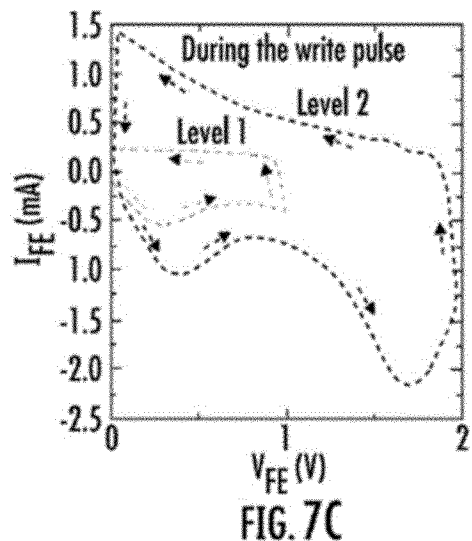

Signed and Sealed this
Twenty-first Day of March, 2023

Katherine Kelly Vidal
Director of the United States Patent and Trademark Office

CERTIFICATE OF CORRECTION (continued)
U.S. Pat. No. 11,532,355 B2

Should read:

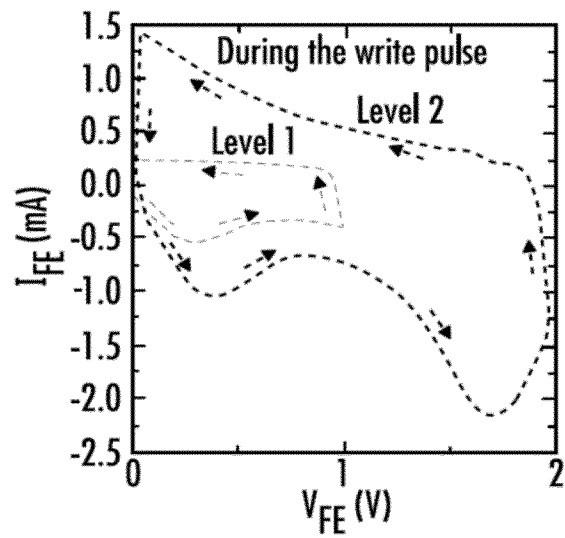

FIG. 7C

FIG. 8D reads:

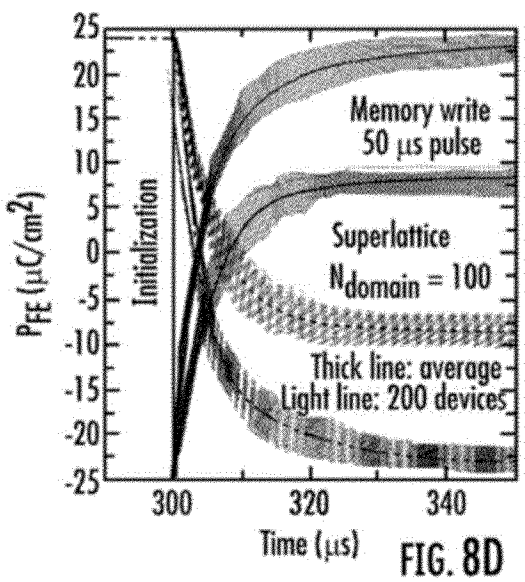

FIG. 8D

CERTIFICATE OF CORRECTION (continued)
U.S. Pat. No. 11,532,355 B2

Should read:

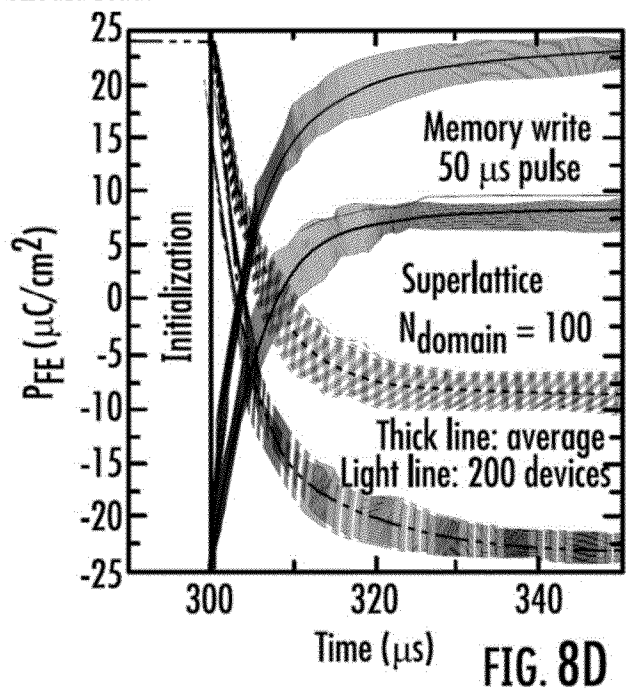

FIG. 8I reads:

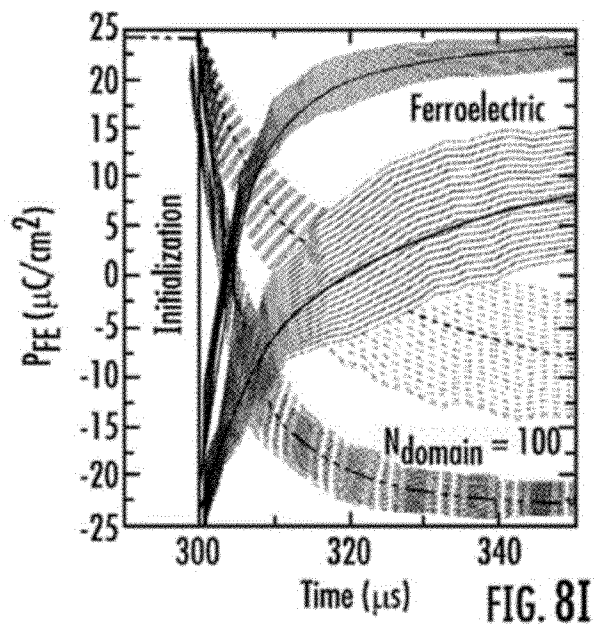

Should read:
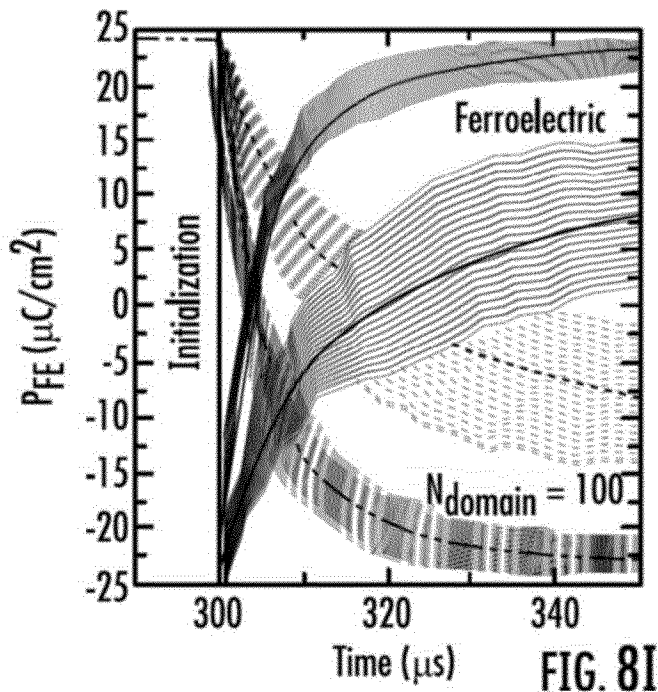
FIG. 8I